US010424432B2

(12) United States Patent
Yosui et al.

(10) Patent No.: US 10,424,432 B2
(45) Date of Patent: Sep. 24, 2019

(54) INDUCTOR BRIDGE AND ELECTRONIC DEVICE

(71) Applicant: Murata Manufacturing Co., Ltd., Nagaokakyo-shi, Kyoto-fu (JP)

(72) Inventors: Kuniaki Yosui, Nagaokakyo (JP); Noboru Kato, Nagaokakyo (JP); Nobuo Ikemoto, Nagaokakyo (JP); Naoto Ikeda, Nagaokakyo (JP); Yuki Wakabayashi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 29 days.

(21) Appl. No.: 15/408,635

(22) Filed: Jan. 18, 2017

(65) Prior Publication Data

US 2017/0125156 A1    May 4, 2017

Related U.S. Application Data

(63) Continuation of application No. 14/814,583, filed on Jul. 31, 2015, now Pat. No. 9,672,970, which is a
(Continued)

(30) Foreign Application Priority Data

Feb. 19, 2013  (JP) .................................. 2013-029783
Mar. 15, 2013  (JP) .................................. 2013-053920
(Continued)

(51) Int. Cl.
*H01F 5/00*        (2006.01)
*H01F 27/29*       (2006.01)
(Continued)

(52) U.S. Cl.
CPC ......... *H01F 27/2804* (2013.01); *H01F 27/29* (2013.01); *H05K 1/028* (2013.01);
(Continued)

(58) Field of Classification Search
CPC .... H01F 27/2804; H01F 27/29; H01F 27/292; H01F 17/003; H01F 17/0013;
(Continued)

(56) References Cited

U.S. PATENT DOCUMENTS 7,719,398 B2 *  5/2010  Tsuzuki ............. H01F 17/0013
                                                  336/200
7,791,900 B2 *  9/2010  Fouquet .................. H01F 19/08
                                                  361/803
(Continued)

OTHER PUBLICATIONS

Yosui et al., "Inductor Bridge and Electronic Device", U.S. Appl. No. 14/814,583, filed Jul. 31, 2015.

*Primary Examiner* — Mang Tin Bik Lian
(74) *Attorney, Agent, or Firm* — Keating & Bennett, LLP

(57) ABSTRACT

An inductor bridge is configured to bridge-connect a first circuit and a second circuit to each other, and includes a flexible flat plate base body, a first connector at a first end portion of the base body and connected to the first circuit, a second connector at a second end portion of the base body and connected to the second circuit, and an inductor section in the base body between the first connector and the second connector. The inductor section includes conductor patterns including a plurality of layers. The inductor bridge further includes a bending portion between the inductor section and the first connector, and a slot at an inner side of the bending portion that reduces a thickness of the base body.

4 Claims, 11 Drawing Sheets

Related U.S. Application Data continuation of application No. PCT/JP2014/052028, filed on Jan. 30, 2014.

(30) Foreign Application Priority Data

| May 24, 2013 | (JP) | ................................. | 2013-110119 |
| Jun. 6, 2013 | (JP) | ................................. | 2013-119385 |
| Sep. 17, 2013 | (JP) | ................................. | 2013-191575 |

(51) Int. Cl.

| *H01F 27/28* | (2006.01) |
| *H05K 1/02* | (2006.01) |
| *H05K 1/16* | (2006.01) |
| *H05K 3/46* | (2006.01) |
| *H05K 1/18* | (2006.01) |
| *H01F 17/00* | (2006.01) |
| *H05K 3/00* | (2006.01) |
| *H05K 3/40* | (2006.01) |
| *H05K 1/14* | (2006.01) |

(52) U.S. Cl.
CPC ........... *H05K 1/0281* (2013.01); *H05K 1/165* (2013.01); *H05K 1/181* (2013.01); *H05K 3/4691* (2013.01); *H01F 2017/006* (2013.01); *H01F 2027/2809* (2013.01); *H01F 2027/295* (2013.01); *H05K 1/147* (2013.01); *H05K 3/0035* (2013.01); *H05K 3/4015* (2013.01); *H05K 2201/09036* (2013.01); *H05K 2201/09672* (2013.01); *H05K 2201/09845* (2013.01); *H05K 2201/10098* (2013.01); *H05K 2203/0384* (2013.01)

(58) Field of Classification Search
CPC ....... H01F 2027/006; H01F 2027/0073; H01F 5/003; H01F 2005/046; H01F 2005/043; H05K 1/181; H05K 1/165; H05K 1/028
USPC ........................................ 336/223, 192, 200
See application file for complete search history.

(56) References Cited

U.S. PATENT DOCUMENTS

| 2007/0285335 | A1* | 12/2007 | Bungo | ................... | H01Q 1/243 |
| | | | | | 343/895 |
| 2009/0266900 | A1* | 10/2009 | Ikemoto | ................. | H01Q 1/243 |
| | | | | | 235/492 |

* cited by examiner

INDUCTOR BRIDGE AND ELECTRONIC DEVICE

BACKGROUND OF THE INVENTION

1. Field of the Invention

The present invention relates to an element connecting two circuits. More particularly, the present invention relates to an inductor bridge including an inductance component, and to an electronic device including the inductor bridge.

2. Description of the Related Art

In a small-sized electronic device, such as a mobile terminal, which includes a plurality of circuit mounting members, e.g., boards, in a casing, the circuit mounting members are connected to each other by a flat cable having flexibility, as disclosed in International Publication No. 2005/114778, for example.

In a related-art electronic device including a plurality of boards that are connected to each other by a flat cable, electronic components are mounted to the boards, as required, to constitute a circuit per board, and the flat cable is used simply as a wiring member for connection between the boards.

In the above-described electronic device including the plurality of circuit mounting members such as boards, for example, an inductor required for the circuit is realized by mounting a chip inductor to the board, or by forming a conductor pattern for the inductor on the board.

However, the structure of mounting the chip inductor to the board has a difficulty in thinning the board and provides a factor impeding size reduction in the entirety of the electronic device. On the other hand, the structure of forming the inductor as the conductor pattern (hereinafter called a "pattern inductor") occupies a relatively large area with respect to the circuit formed on the board, and also provides a factor impeding size reduction of the electronic device.

It is a matter of course that, in any of the cases using the chip inductor and the pattern inductor, the size reduction can be realized by forming a finer conductor pattern. However, the finer conductor pattern causes the problem of increasing a DC resistance component and reducing a Q-value.

SUMMARY OF THE INVENTION

Preferred embodiments of the present invention achieve size reduction of an electronic device that includes an electronic circuit including an inductor, and provide an inductor bridge that is easy to use in a bent state, and an electronic device including the inductor bridge.

According to a preferred embodiment of the present invention, an inductor bridge bridge-connects a first circuit and a second circuit to each other, the inductor bridge including a flexible flat plate base body, a first connecting portion at a first end portion of the base body and connected to the first circuit, a second connecting portion at a second end portion of the base body and connected to the second circuit, and an inductor section in the base body between the first connecting portion and the second connecting portion, wherein the inductor section includes conductor patterns including a plurality of layers, the inductor bridge further includes a bending portion between the inductor section and the first connecting portion, and a slot at an inner side of the bending portion that reduces a thickness of the base body, and the inductor section includes the conductor patterns that have a coil axis oriented in a direction perpendicular or substantially perpendicular to a principal surface of the base body, and that include the plurality of layers in a helical shape, the helical conductor patterns being located at positions near the slot along a lateral surface of the slot.

When an inductor bridge that bridge-connects two circuits in an electronic device is constituted by incorporating, in a flexible base body, an element or a member including an inductance component, the inductor bridge preferably is assembled into the electronic device in a bent or folded state as the occasion requires. However, using simply the flexible base body causes the problem that it is difficult to bend (or fold) the inductor bridge with a large curvature, and to assemble the inductor bridge into the electronic device in a state bent (folded) with a large curvature. Another problem is, for example, that a bent (folded) position of the inductor bridge is not definitely defined, and electrical characteristics are not stabilized.

With the features described above, the inductor bridge is easily bent at the slot and is able to be bent with a large curvature. Therefore, the inductor bridge is easily assembled into the electronic device in the state bent with a large curvature. Moreover, the bent (folded) position of the inductor bridge is reliably defined and provided, and the electrical characteristics are stabilized.

In addition, the inductor section includes the conductor patterns that have the coil axis oriented in the direction perpendicular or substantially parallel to the principal surface of the base body, and that include the plurality of layers in a helical shape, the helical conductor patterns being located at positions near the slot along the shape of the lateral surface of the slot. Therefore, a line length of the conductor patterns in the inductor section is substantially increased, and the overall size is reduced.

According to another preferred embodiment of the present invention, an inductor bridge that bridge-connects a first circuit and a second circuit to each other includes a flexible flat plate base body, a first connecting portion at a first end portion of the base body and connected to the first circuit, a second connecting portion at a second end portion of the base body and connected to the second circuit, and an inductor section in the base body between the first connecting portion and the second connecting portion, wherein the inductor section includes conductor patterns including a plurality of layers, the inductor bridge further includes a bending portion between the inductor section and the first connecting portion, and a slot at an inner side of the bending portion to reduce a thickness of the base body, and the conductor patterns of the inductor section include a pattern width in a layer closer to a surface of the base body smaller than a pattern width in a layer at an inner side of the base body.

With the structure described above, an undesired capacitance generated between the conductor pattern in the layer closer to the surface of the base body and an external conductor is significantly reduced or prevented.

Preferably, the slot has a sectional shape that is wider at a front opening side than at an inner bottom side of the slot. With this structure, inner surfaces of the slot are less more likely to interfere with each other in the bent state of the inductor bridge, and the inductor bridge is capable of being bent with a larger curvature.

Preferably, a floating electrode (dummy pattern) is provided at a position overlapping the slot when looking at the base body in a plan view. With that structure, the inductor bridge is more apt to plastically deform at the slot, and the occurrence of breakage in the folded portion is significantly reduced or prevented.

According to still another preferred embodiment of the present invention, an electronic device includes the inductor bridge according to any of the preferred embodiments of the present invention described above, the first circuit, and the second circuit, wherein the first circuit is a mounting board inside the electronic device, and the inductor bridge is disposed with the coil axis of the inductor section that is not perpendicular to the mounting board.

With the structure described above, an undesired capacitance generated between the inductor bridge and the mounting board is significantly reduced or prevented.

According to various preferred embodiments of the present invention, the inductor bridge is capable of being easily bent or folded at the slot and is capable of being bent (folded) with a large curvature. Furthermore, the bent (folded) position is definitely defined and electrical characteristics are stabilized.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
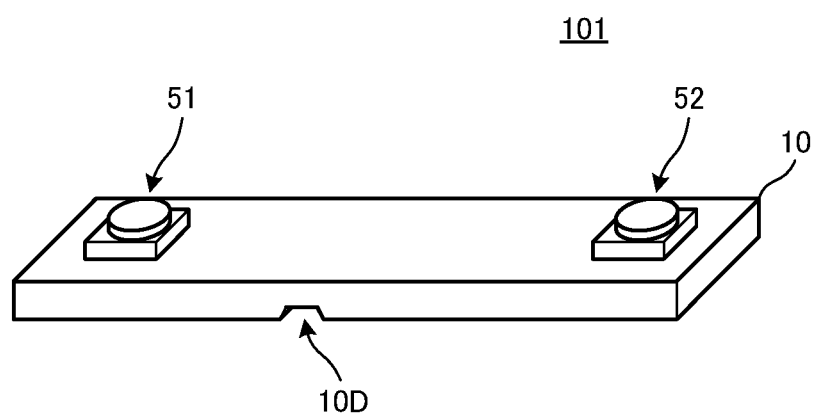
FIG. 1A is a perspective view of an inductor bridge according to a first preferred embodiment of the present invention when looking at the inductor bridge from the connector side.

Preferred embodiments of the present invention will be described below in connection with several practical examples by referring to the drawings. In the drawings, the same components are denoted by the same signs. The following preferred embodiments are merely illustrative, and constituent elements of the different preferred embodiments can be partly replaced or combined in optional ways.

First Preferred Embodiment

Figure 1B:
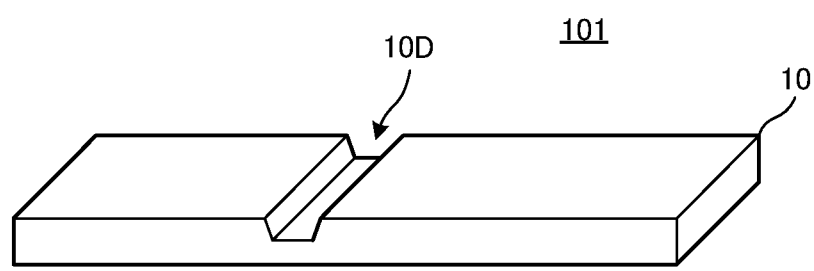
FIG. 1B is a perspective view of the inductor bridge when looking at the inductor bridge from the rear side.

FIG. 1A is a perspective view of an inductor bridge 101 according to a first preferred embodiment of the present invention when looking at the inductor bridge from the connector side, and FIG. 1B is a perspective view of the inductor bridge when looking at the inductor bridge from the rear side.

The inductor bridge 101 is an element configured to bridge-connect a first circuit and a second circuit to each other. As is apparent from FIG. 1A, the inductor bridge 101 includes a base body 10 preferably in the form of a flat plate having flexibility, a first connector 51, and a second connector 52. An inductor section, described later, is preferably provided inside the base body 10. The first connector 51 is disposed in a first end portion of the base body 10 and is connected to the first circuit through mechanical contact between them. The second connector 52 is disposed in a second end portion of the base body and is connected to the second circuit through mechanical contact between them. The first connector 51 corresponds to a "first connecting portion", and the second connector 52 corresponds to a "second connecting portion". Furthermore, as is apparent from FIG. 1B, a slot (groove) 10D is provided in the base body 10 to reduce a thickness of the base body 10. The slot 10D is preferably provided in a bending portion between the inductor section and the first connecting portion.

Figure 2A:
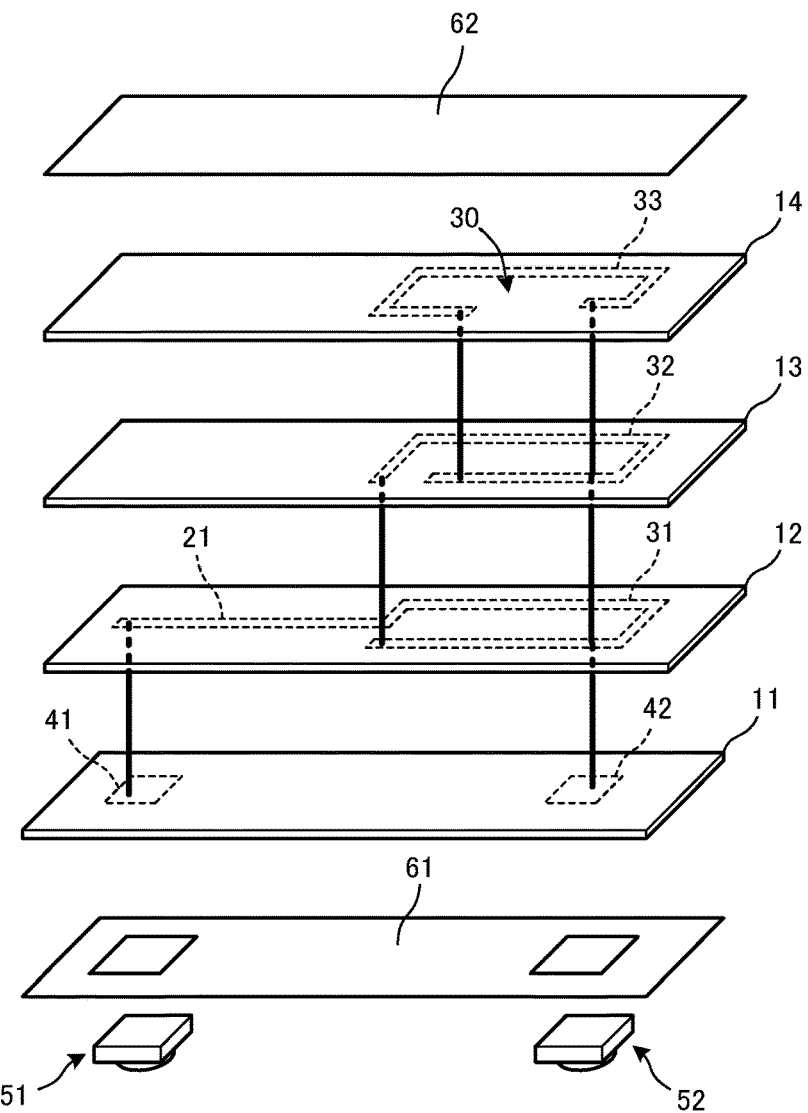
FIG. 2A is an exploded perspective view of the inductor bridge according to the first preferred embodiment of the present invention in a manufacturing process.
Figure 2B:
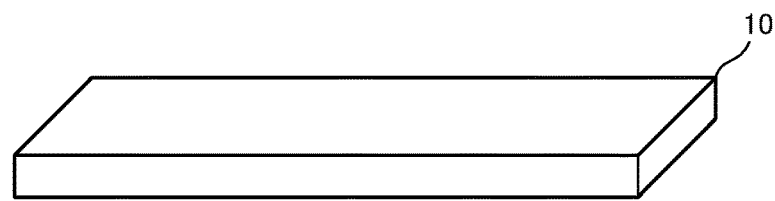
FIG. 2B is a perspective view of a base body.

FIG. 2A is an exploded perspective view of the inductor bridge 101 according to the first preferred embodiment in a manufacturing process, and FIG. 2B is a perspective view of the base body 10.

As is apparent from FIG. 2A, the base body 10 preferably is formed by laminating flexible resin base materials 11, 12, 13 and 14 that are each, e.g., a liquid crystal polymer (LCP). The laminated resin base materials 12, 13 and 14 provide an inductor section 30 that includes conductor patterns 31, 32 and 33 and interlayer connecting conductors (hereinafter referred to as "via conductors"). The inductor section 30 constitutes a coil preferably having a rectangular or substantially rectangular helical shape with a coil axis oriented in a direction perpendicular or substantially perpendicular to surfaces of the resin base materials 12, 13 and 14 (i.e., perpendicular or substantially perpendicular to a principal surface of the base body). A first end of a wiring pattern 21 is connected to one end of the conductor pattern 31.

Connector mounting electrodes 41 and 42 to mount the connectors 51 and 52, respectively, are provided on the resin base material 11. The connector mounting electrode 41 is connected to a second terminal of the wiring pattern 21 through the via conductor. The connector mounting electrode 42 is connected to one end of the conductor pattern 33 through the via conductor.

A resist layer 61 is provided on a lower surface of the resin base material 11, and a resist layer 62 is provided on an upper surface of the resin base material 14. It is to be noted that the resist layer 62 is not essential and it may be omitted in some cases.

The slot 10D illustrated in FIGS. 1A and 1B is formed preferably by laser processing, for example. In particular, when the resin base materials are each the liquid crystal polymer (LCP), exposed inner surfaces of the slot are fusion-bonded together by carrying out the laser processing. Therefore, gaps between laminated layers are less likely to occur, and the interface between adjacent two layers of the plural resin base materials is harder to peel off. As a result, reliability of the inductor bridge 101 is ensured, and ingress of moisture through the interface is less apt to occur.

The slot 10D may be formed by cutting work using a dicer, for example. Alternatively, the slot 10D may be obtained by previously forming a slit in a region of each of predetermined ones of the plural resin base materials to be laminated, where the slot is to be formed after laminating the resin base materials.

A non-limiting example of a method for manufacturing the inductor bridge 101 is as follows.

First, various electrodes and conductor patterns are formed on the resin base materials 11 to 14 by laminating, for each layer, the resin base material and a metal foil (e.g., a copper foil), and by patterning the metal foil with photolithography, for example. Then, the via conductors are formed through the resin base materials 12, 13 and 14. The via conductors are each formed by boring a penetration hole in the resin base material with a laser, for example, putting a conductive paste, which contains copper, silver, tin or the like, in the penetration hole, and by solidifying the conductive paste in a subsequent heating and pressing step.

A laminate is obtained by stacking the resin base materials 11 to 14, and by heating and pressing them.

The resist layers 61 and 62 are formed respectively on opposite surfaces of the laminate by printing.

The slot 10D is formed.

The individual inductor bridges 101 are obtained by cutting a collective board into pieces.

The inductor bridge 101 is bent at the slot 10D while the base body of the inductor bridge 101 is heated.

The connectors 51 and 52 are mounted by soldering.

Figure 3A:
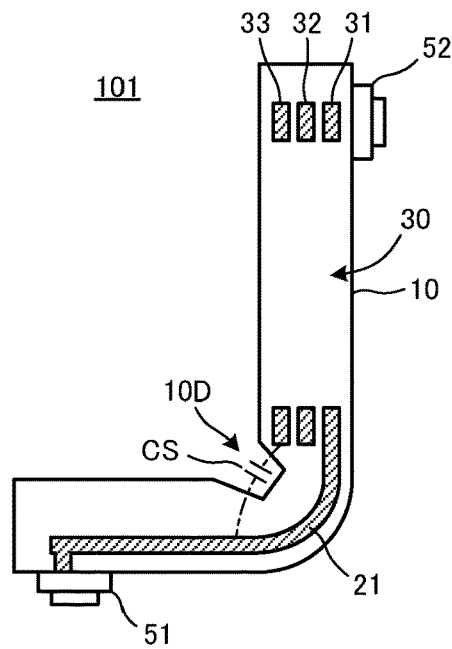
FIG. 3A is a sectional view of the inductor bridge according to the first preferred embodiment of the present invention in a bent (folded) state.
Figure 3B:
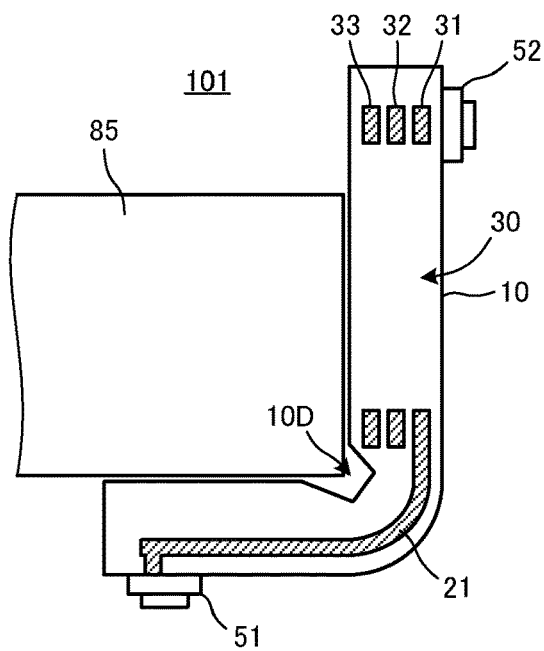
FIG. 3B is a sectional view of the inductor bridge in a state arranged along an external member.

FIG. 3A is a sectional view of the inductor bridge 101 according to the first preferred embodiment in a bent (folded) state, and FIG. 3B is a sectional view of the inductor bridge 101 in a state arranged along an external member 85. The inductor bridge 101 is used in the state folded at the slot 10D such that the slot 10D is positioned at the inner side of bending (i.e., the inner peripheral side of a bent portion).

Thus, since the slot (groove) 10D is preferably provided at the inner side of the bending portion to reduce the thickness of the base body 10, the inductor bridge 101 is capable of being easily bent at the slot 10D and is able to be bent with a large curvature. Furthermore, since the inductor bridge 101 is folded at the position of the slot 10D, a position at which the inductor bridge 101 is folded is reliably and accurately defined, and electrical characteristics are stabilized. In other words, since a position at which the inductor section 30 is formed is less susceptible to bending, fluctuations of the electrical characteristics are kept smaller when the inductor bridge 101 defines and functions as an inductor.

Besides, the slot 10D preferably has a sectional shape such that a width of the slot is larger at the front opening side (i.e., the inner side when viewed in a bending direction) than at the inner bottom side. Therefore, the inductor bridge is capable of being folded with a larger curvature.

Even when the slot is provided at the outer side of the bending (i.e., at the outer peripheral side of the bent portion), for example, the inductor bridge also is capable of being folded with a large curvature. However, such a case accompanies the problem that cracking or breakage is more likely to occur in the slot.

In FIG. 3A, a stray capacitance CS represents a stray capacitance generated particularly between the conductor pattern 33 and the wiring pattern 21. When the inductor bridge 101 is bent (folded), an opposing component area between the conductor pattern 33 and the wiring pattern 21 is increased, and the spacing between them is narrowed. Accordingly, the stray capacitance CS is generated. On the other hand, in the inductor bridge 101, the slot 10D is provided in the base body 10 at the bent (folded) position, and the slot 10D provides a space in which the base body 10 having a certain dielectric constant is not provided, the space being filled with air. Hence the stray capacitance CS is held relatively small. As a result, the self-resonance frequency of the inductor is kept relatively high, and the inductor bridge is able to be used over a wider band.

Figure 4A:
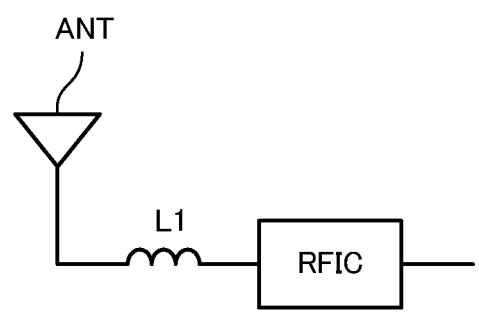
FIG. 4A is a circuit diagram illustrating an example of an application of the inductor bridge to an electronic device.
Figure 4B:
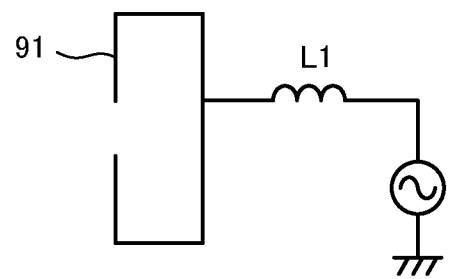
FIG. 4B is an equivalent circuit diagram thereof.

FIG. 4A is a circuit diagram illustrating an example of application of the inductor bridge 101 to an electronic device, and FIG. 4B is an equivalent circuit diagram thereof. An inductor L1 in FIGS. 4A and 4B corresponds to the inductor bridge 101. An antenna element pattern 91 is provided on an antenna board, for example. The first connector 51 of the inductor bridge 101 is connected to a feeding point of the antenna element pattern 91 or to a position extended from the feeding point. The second connector 52 of the inductor bridge 101 is connected to a connecting portion that is provided on an upper surface of a mounting board.

As illustrated in FIG. 4A, impedance matching between a feed circuit (RFIC) and an antenna ANT and frequency characteristics of the antenna are determined by the inductor L1 that is connected between the antenna ANT and the RFIC.

Figure 5A:
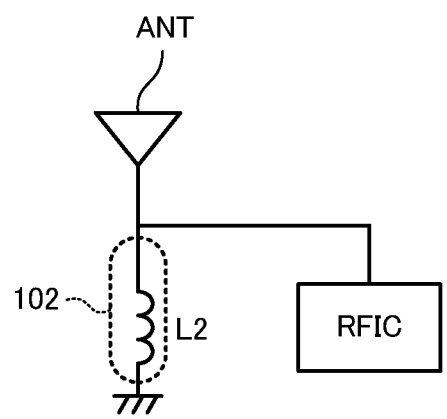
FIG. 5A is a block diagram illustrating another example of an application of the inductor bridge.
Figure 5B:
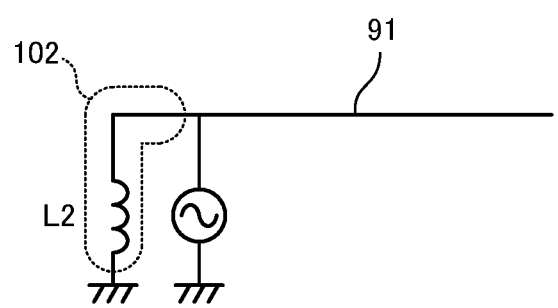
FIG. 5B is an equivalent circuit diagram thereof.

FIG. 5A is a block diagram illustrating another example of application of the inductor bridge, and FIG. 5B is an equivalent circuit diagram thereof. In this example, an antenna is preferably configured by inserting an inductor between a ground connecting point of an inverted F-type antenna and a ground.

In FIGS. 5A and 5B, an inductor L2 corresponds to the inductor bridge 101. The inductor L2 is connected between an antenna ANT and the ground, thus constituting the inverted F-type antenna. More specifically, as illustrated in FIG. 5B, the inductor L2 is connected between one end of an antenna element pattern 91 and the ground, and a feed circuit (RFIC) is connected to the antenna element pattern 91 at a position near the inductor L2.

Second Preferred Embodiment

Figure 6:
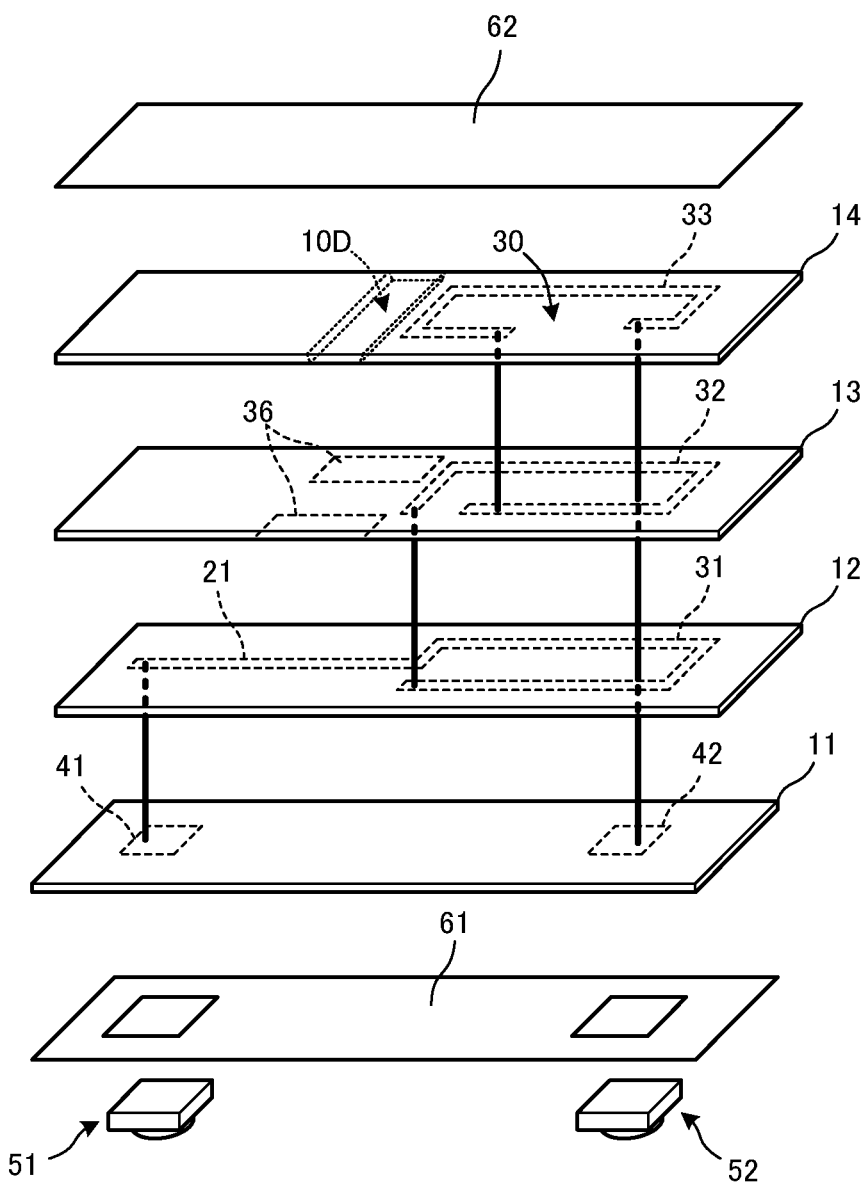
FIG. 6 is an exploded perspective view of an inductor bridge according to a second preferred embodiment of the present invention in a manufacturing process.
Figure 7:
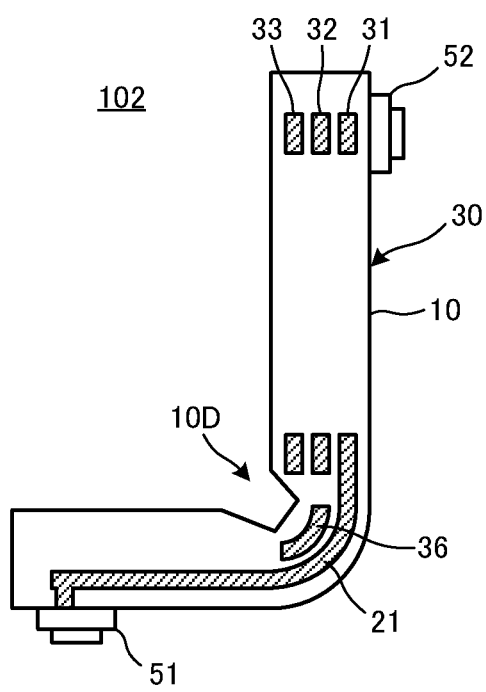
FIG. 7 is a sectional view of the inductor bridge according to the second preferred embodiment of the present invention in a bent (folded) state.

FIG. 6 is an exploded perspective view of an inductor bridge 102 according to a second preferred embodiment in a manufacturing process. FIG. 7 is a sectional view of the inductor bridge 102 in a bent (folded) state.

A floating electrode (dummy electrode) 36 is provided on the resin base material 13 in addition to the conductor pattern 32 of the inductor section 30. The other points preferably are the same as those in the inductor bridge 101, illustrated in FIGS. 2A and 2B, described in the first preferred embodiment. The slot 10D is also illustrated in FIG. 6.

The floating electrode 36 is provided at a position overlapping the slot 10D when looking at the base body 10 in a plan view. Because the floating electrode 36 is plastically deformed, the inductor bridge 101 is more apt to plastically deform at the slot 10D. Furthermore, because the floating electrode 36 acts to relieve stress concentrated on a bent portion, the occurrence of breakage of the bent portion and disconnection of the wiring pattern 21 is significantly reduced or prevented. The floating electrode 36 may be provided in the layer positioned farther than the wiring pattern 21 when viewed from the slot 10D.

Additionally, the floating electrode 36 is provided at the position not overlapping the wiring pattern 21 when looking at the base body 10 in a plan view. Therefore, the influence of the floating electrode 36 upon the electrical characteristics is small.

The floating electrode 36 may be provided at a position entirely overlapping the position where the slot 10D is formed. With such a structure, when the slot 10D is preferably formed by the laser processing, the floating electrode 36 preferably is used as a stopper for a laser beam, and accuracy in depth of the slot 10D is increased.

Third Preferred Embodiment

Figure 8:
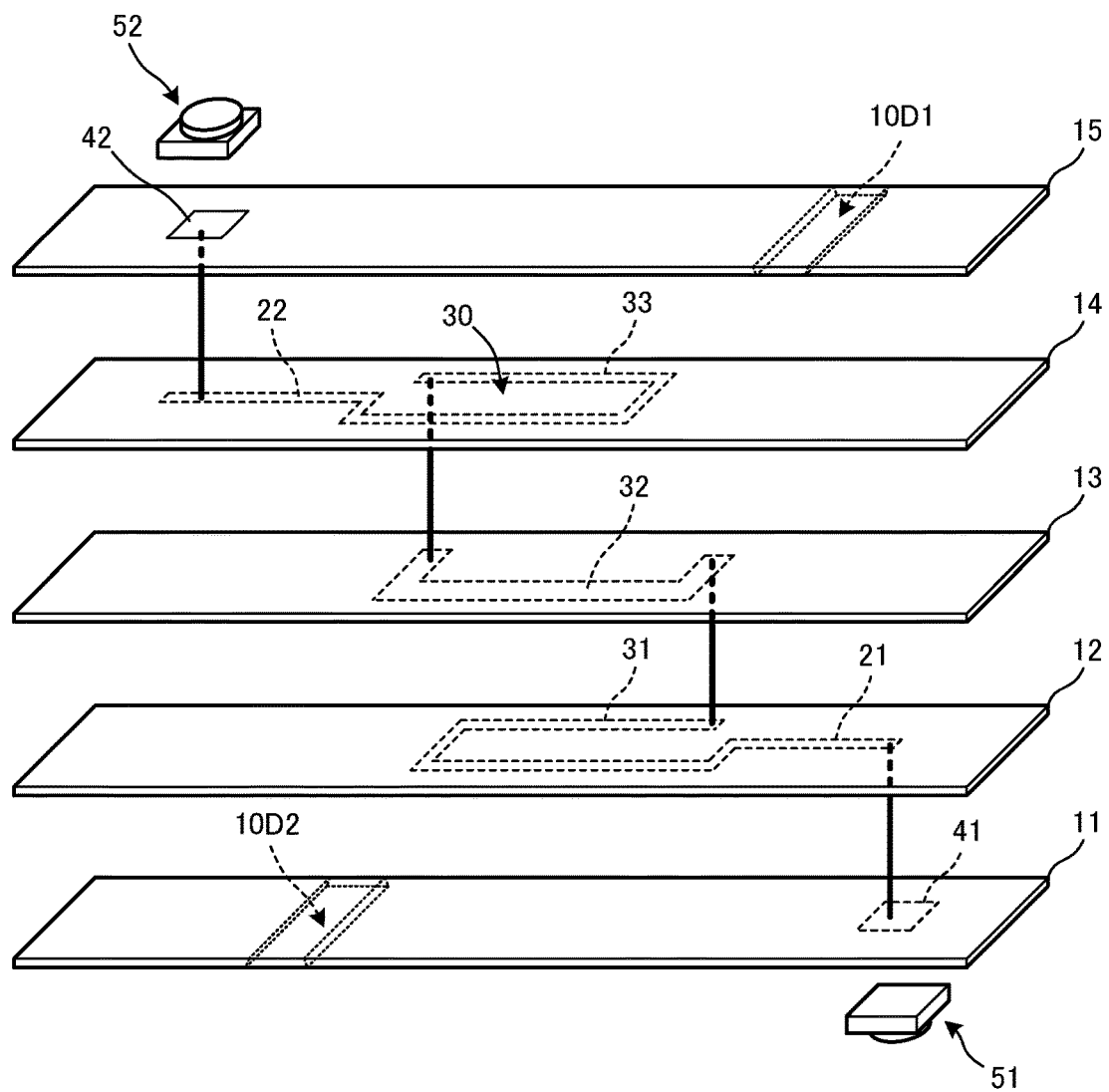
FIG. 8 is an exploded perspective view of an inductor bridge according to a third preferred embodiment of the present invention in a manufacturing process.
Figure 9:
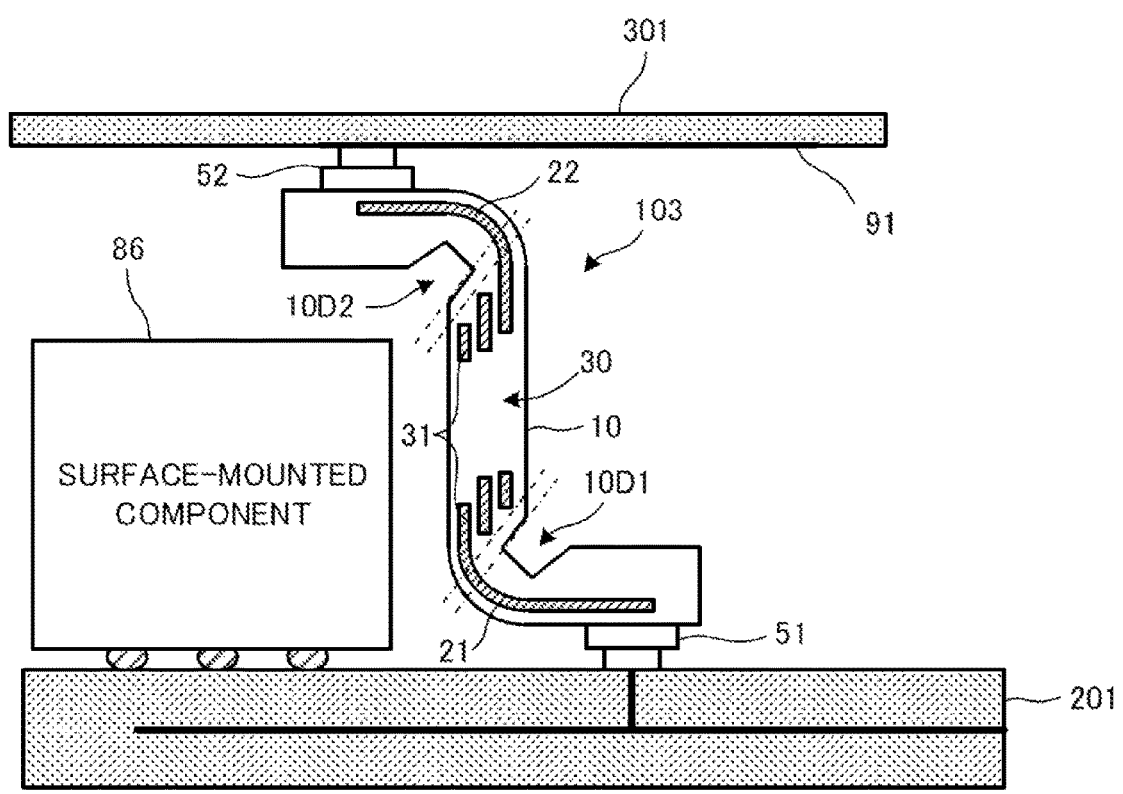
FIG. 9 is a sectional view of the inductor bridge according to the third preferred embodiment of the present invention in a state assembled into an electronic device.

FIG. 8 is an exploded perspective view of an inductor bridge 103 according to a third preferred embodiment of the present invention in a manufacturing process. FIG. 9 is a sectional view of the inductor bridge 103 in a state assembled into an electronic device.

As is apparent from FIG. 8, an inductor section 30 including conductor patterns 31, 32 and 33 and via conductors is formed in three 12 to 14 of resin base materials 11 to 15. The inductor section 30 constitutes a coil preferably with a rectangular or substantially rectangular helical shape. A first end of a wiring pattern 21 is connected to one end of the conductor pattern 31.

A base body of the inductor bridge 103 is preferably formed by laminating the above-mentioned plural resin base materials. Line widths of the conductor patterns 31 and 33 provided in layers closer to both surfaces of the base body are smaller than that of the conductor pattern 32 provided in a layer positioned at the inner side of the base body. Therefore, as described later, it is possible to reduce an undesired capacitance that is generated between the conductor patterns provided in the layers closer to the surfaces of the base body and an external conductor.

Connector mounting electrodes 41 and 42 to mount the connectors 51 and 52 are provided on the resin base materials 11 and 15, respectively. The connector mounting electrode 41 is connected to a second terminal of the wiring pattern 21 through the via conductor. The connector mounting electrode 42 is connected to an end portion of a wiring pattern 22 through the via conductor.

When looking at the base body in a plan view, a slot 10D1 is provided at a position intersecting the wiring pattern 21. Moreover, a slot 10D2 is provided at a position intersecting the wiring pattern 22. With such an arrangement, the inductor bridge 103 is able to be used in a state bent at two bending portions.

FIG. 9 is a sectional view illustrating a state where a mounting board 201 and an antenna board 301 are connected to each other by the inductor bridge 103.

The above-mentioned antenna element pattern 91 is provided on the antenna board 301. The second connector 52 of the inductor bridge 103 is connected to an end portion of the antenna element pattern 91 or to a position extended from the relevant end portion. The first connector 51 of the inductor bridge 103 is connected to a connecting portion that is provided on an upper surface of the mounting board 201.

The inductor bridge 103 of this preferred embodiment is applied, for example, to an inductor portion in the circuit illustrated in FIGS. 4A and 4B or illustrated in FIGS. 5A and 5B.

A surface-mounted component 86 is mounted to the mounting board 201.

The conductor pattern 31 as a portion of the inductor section 30 of the inductor bridge 103 is provided at a position opposing to the surface-mounted component 86. Since the line width of the conductor pattern 31 is relatively small as described above, an undesired capacitance generated between the conductor pattern 31 and the surface-mounted component 86 is small.

Furthermore, as denoted by one-dot-chain lines in FIG. 9, the conductor patterns of the inductor section 30 are configured such that their ends are positioned near the slots 10D1 and 10D2 along respective shapes of lateral surfaces of the slots 10D1 and 10D2. More specifically, referring to FIG. 8, the conductor patterns 31, 32 and 33 are gradually shifted in a lengthwise direction of the base body in an obliquely arrayed fashion. Stated in another way, the conductor patterns 31, 32 and 33 are configured such that a coil winding axis of the inductor section 30 is inclined obliquely with respect to the direction perpendicular or substantially perpendicular to the base body. With such a structure, a line length of the conductor patterns 31, 32 and 33 in the inductor section 30 is substantially increased, and the overall size is reduced.

Fourth Preferred Embodiment

Figure 10:
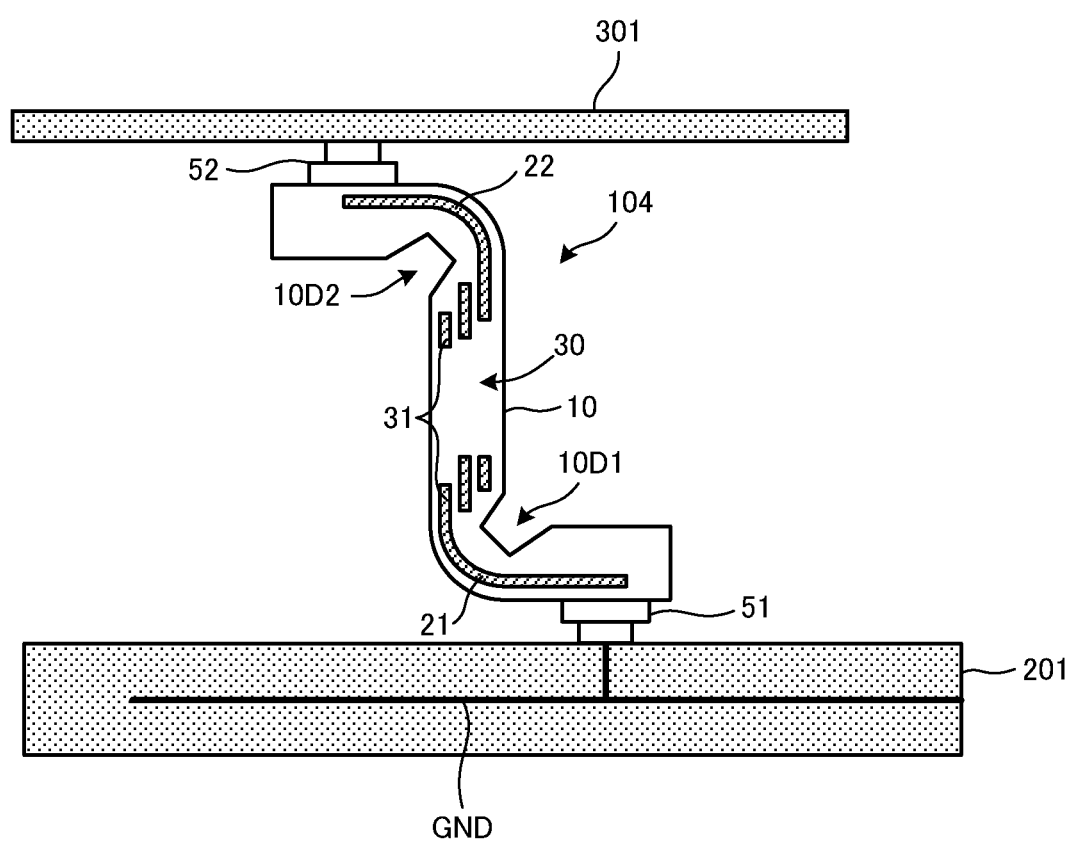
FIG. 10 is a sectional view of an inductor bridge according to a fourth preferred embodiment of the present invention in a state assembled into an electronic device, the sectional view illustrating a state where a mounting board and an antenna board are connected to each other by the inductor bridge.

FIG. 10 is a sectional view of an inductor bridge 104 according to a fourth preferred embodiment of the present invention in a state assembled into an electronic device, the sectional view illustrating a state where a mounting board 201 and an antenna board 301 are connected to each other by the inductor bridge 104. The inductor bridge 104 preferably has the same structure as that in the third preferred embodiment of the present invention illustrated in FIG. 8.

As illustrated in FIG. 10, the above-mentioned antenna element pattern is provided on the antenna board 301. The second connector 52 of the inductor bridge 104 is connected to an end portion of the antenna element pattern or to a position extended from the relevant end portion. The first connector 51 of the inductor bridge 104 is connected to a connecting portion that is provided on an upper surface of the mounting board 201. The connecting portion on the mounting board 201 is electrically conducted to a ground conductor GND extending in a planar shape.

The inductor bridge 104 is disposed such that the inductor section 30 thereof extends in a direction perpendicular or substantially perpendicular to the mounting board 201. With such an arrangement, a coil winding axis of the inductor section 30 lies parallel or substantially parallel to the ground conductor GND that is formed in the mounting board 201. Therefore, the inductor section 30 is made less susceptible to the influence of the ground conductor GND. In other words, undesired coupling between the inductor section 30 and the ground conductor GND is significantly reduced or prevented, and an eddy current generated in the ground conductor GND is also significantly reduced or prevented.

It is to be noted that the coil winding axis of the inductor section 30 is not always required to be perfectly parallel to the mounting board 201, and that insofar as the coil winding axis is set at least to be not perpendicular to the mounting board 201, the above-mentioned effect is generated at a certain extent depending on an angle of the coil winding axis with respect to the mounting board 201. For the purpose of reducing the eddy current, an angle defined between a plane defined by the inductor section 30 and the mounting board is preferably within a range of about 60° to about 120°, for example. More preferably, such an angle is within a range of about 80° to about 100°, for example.

Fifth Preferred Embodiment

Figure 11:
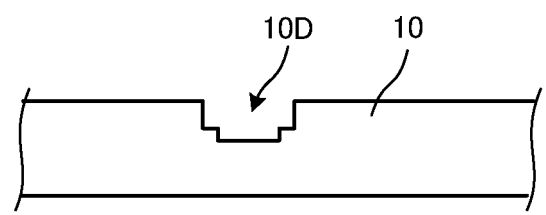
FIG. 11 is a sectional view of a principal portion of an inductor bridge according to a fifth preferred embodiment of the present invention.

FIG. 11 is a sectional view of a principal portion of an inductor bridge according to a fifth preferred embodiment of the present invention. While, in the preferred embodiments described above, the slot having an inverted trapezoidal shape in section is preferably provided in the base body 10, the sectional shape of the slot is not limited to the inverted trapezoidal shape. The slot may have a step-shaped configuration as illustrated in FIG. 11.

While the preferred embodiments have been described above in connection with an example in which the base body of the inductor bridge is folded at an angle of about 90°, for example, the folded angle may be an acute angle or an obtuse angle. Moreover, while the preferred embodiments have been described above in connection with an example in which the base body of the inductor bridge is bent (folded) at one or two positions, it may be bent (folded) at three or more positions.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An inductor bridge configured to bridge-connect a first circuit and a second circuit to each other, the inductor bridge comprising:
   a flexible flat plate base body;
   a first electrode at a first end portion of the base body;
   a second electrode at a second end portion of the base body;
   a first connector at the first end portion of the base body, mounted on the first electrode and connected to the first circuit;
   a second connector at the second end portion of the base body, mounted on the second electrode and connected to the second circuit; and
   an inductor section in the base body between the first connector and the second connector, the inductor section being connected to the first electrode and the second electrode; wherein
   the inductor section includes conductor patterns including a plurality of layers;
   the conductor patterns of the inductor section include a pattern width on a layer closer to a surface of the base body that is smaller than a pattern width on a layer at an inner side of the base body;
   the inductor bridge includes a bending portion between the inductor section and the first connector;
   the second circuit is in contact with a member different from a member with which the first circuit is in contact; and
   the member in contact with the first circuit and the member in contact with the second circuit are not included in the inductor bridge.

2. The inductor bridge according to claim 1, wherein the inductor section defines a coil with a helical or substantially helical shape.

3. An electronic device comprising:
   an inductor bridge configured to bridge-connect a first circuit and a second circuit to each other;
   the first circuit; and
   the second circuit; wherein
   the inductor bridge includes:
      a flexible flat plate base body;
      a first electrode at a first end portion of the base body;
      a second electrode at a second end portion of the base body;
      a first connector at the first end portion of the base body, mounted on the first electrode and connected to the first circuit;
      a second connector at the second end portion of the base body, mounted on the second electrode and connected to the second circuit; and
      an inductor section in the base body between the first connector and the second connector, the inductor section being connected to the first electrode and the second electrode;
   the inductor section includes conductor patterns including a plurality of layers;
   the conductor patterns of the inductor section include a pattern width on a layer closer to a surface of the base body that is smaller than a pattern width on a layer at an inner side of the base body;
   the first circuit is in contact with a mounting board inside the electronic device;
   the conductor patterns of the inductor bridge are provided at a position opposing a surface-mounted component on the mounting board;
   the inductor bridge includes a bending portion between the inductor section and the first connector;
   the second circuit is in contact with a member different from the mounting board; and
   the mounting board in contact with the first circuit and the member in contact with the second circuit are not included in the inductor bridge.

4. The electronic device according to claim 3, wherein the inductor section defines a coil with a helical or substantially helical shape.

* * * * *